(12) United States Patent
Hashimoto

(10) Patent No.: US 7,460,576 B2
(45) Date of Patent: Dec. 2, 2008

(54) SEMICONDUCTOR OPTICAL AMPLIFIER

(75) Inventor: Jun-ichi Hashimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 20 days.

(21) Appl. No.: 11/390,466

(22) Filed: Mar. 28, 2006

(65) Prior Publication Data

US 2006/0245463 A1  Nov. 2, 2006

(30) Foreign Application Priority Data

Mar. 29, 2005  (JP) .................... P2005-095613

(51) Int. Cl.
*H01S 5/00* (2006.01)
(52) U.S. Cl. ................ 372/50.22; 372/50.11; 372/50.1; 372/50.121
(58) Field of Classification Search ................ 372/50.1, 372/50.11
See application file for complete search history.

(56) References Cited

U.S. PATENT DOCUMENTS 5,084,894 A * 1/1992 Yamamoto ............... 372/50.22
5,233,187 A * 8/1993 Sakata et al. ............ 250/227.24
5,299,045 A * 3/1994 Sekiguchi ................... 398/95
5,771,254 A * 6/1998 Baldwin et al. ............. 372/31
6,163,557 A * 12/2000 Dunnrowicz et al. ..... 372/46.01
6,785,430 B2 * 8/2004 Paniccia ..................... 385/10
2003/0063647 A1 * 4/2003 Yoshida et al. .............. 372/50

OTHER PUBLICATIONS

Michael J. Connelly, "Semiconductor Optical Amplifiers", Publications, pp. 111-113, Mar. 27, 2002.

* cited by examiner

*Primary Examiner*—Minsun Harvey
*Assistant Examiner*—Kinam Park
(74) *Attorney, Agent, or Firm*—Smith, Gambrell & Russell, LLP

(57) ABSTRACT

A semiconductor optical amplifier according to the present invention comprises a lower cladding layer of a first conductive type, an upper cladding layer of a second conductive type, an active layer, and a diffraction grating layer. The lower cladding layer includes first and second regions. The first and second regions are arranged in a predetermined direction, and the upper cladding layer is supported by the first region. The active layer is provided between the first region of the lower cladding layer and the upper cladding layer, and the diffraction grating layer has a diffraction grating. The diffraction grating extends in the predetermined direction. The diffraction grating layer is supported by the second region, and the diffraction grating layer is optically coupled to the active layer.

13 Claims, 7 Drawing Sheets

SEMICONDUCTOR OPTICAL AMPLIFIER

BACKGROUND OF THE INVENTION

1. Field of the Invention

The present invention relates to a semiconductor optical amplifier.

2. Related Background of the Invention

Semiconductor optical amplifiers have the following advantages: small size, low power consumption and low cost and are expected to become the key device for future optical communications. Thus, grow in demand for these semiconductor optical amplifiers are also expected.

Output light of a semiconductor optical amplifier contains amplified spontaneous emission light in addition to an amplified optical signal. The amplified spontaneous optical lights are generated at random independent of incoming optical signals and therefore become noise components against the incoming optical signals.

The addition of these noise components coming from the spontaneous emission lights degrades the quality of the amplified optical signals, and this affects the transmission characteristics thereof. In order to reduce the spontaneous emission light, a conventional optical amplifying system has band pass filters to eliminate spontaneous emission lights outside the wavelength range of optical signals, and these band pass filters are provided at the output side of an optical semiconductor amplifier in the system (Please refer to Michael J. Connelly, "Semiconductor Optical Amplifiers," Kluwer Academic Publications, pp 111-113).

SUMMARY OF THE INVENTION

These filters should pass through only the optical wavelength components of the amplified optical signals, so that their wavelength passbands should be adjusted exactly to the wavelengths ranges of the amplified optical signals, which leads to a difficulty in the filter production, and increases the filter cost. Further, the introduction of the optical filter enlarges the system size. Especially, in the case of WDM systems in which a multiplexed optical signal containing a number of wavelength components is transmitted and in the case of the access network systems in which a great number of receiving terminals are used, a great number of optical filters are used therein in proportion to the number of the wavelength components and the receiving terminals, and therefore the introduction of the filters greatly increases their system cost and enlarges system size.

It is an object of the present invention to provide a compact, and low cost semiconductor optical amplifier that can remove amplified spontaneous optical emission lights.

According to one aspect of the present invention, a semiconductor optical amplifier comprises a lower cladding layer of a first conductive type, an upper cladding layer of a second conductive type, an active layer, and a diffraction grating layer. The lower cladding layer includes first and second regions, and the first and second regions are arranged in a predetermined direction. The upper cladding layer is supported by the first region, and the active layer is provided between the first region of the lower cladding layer and the upper cladding layer. The diffraction grating layer has a diffraction grating, and the diffraction grating extends in the predetermined direction. The diffraction grating layer is supported by the second region, and the diffraction grating layer is optically coupled to the active layer.

In the semiconductor optical amplifier according to the present invention, the diffraction grating in the diffraction grating layer may have a single period.

In the semiconductor optical amplifier according to the present invention, the diffraction grating layer may include plural regions arranged sequentially in the predetermined direction. Each region has a diffraction grating and the period of the diffraction grating of each region is different from those of other regions.

In this case, the period of the diffraction grating of each region may be adjusted such that each region of the diffraction grating layer emits light of a center wavelength different from each other but the emission direction of the light is same in all regions.

Furthermore, the period of the diffraction grating of each region may be adjusted such that each region of the diffraction grating layer emits light of a center wavelength different from each other and the emission direction of the light of each region is different from those of other regions.

The semiconductor optical amplifier according to the present invention may further comprise a reflection controlling layer provided on the diffraction grating layer. The reflection controlling layer has a reflectivity different from that of diffraction grating layer.

The semiconductor optical amplifier according to the present invention may further comprise a first optical confinement layer and a second optical confinement layer. The first optical confinement layer is provided between the active layer and the lower cladding layer, and the first optical confinement layer has a bandgap energy between that of the active layer and that of the lower cladding layer. The second optical confinement layer is provided between the active layer and the upper cladding layer, and the second optical confinement layer has a bandgap energy between that of the active layer and that of the upper cladding layer.

In the semiconductor optical amplifier according to the present invention, the second region of the lower cladding layer has a third region and fourth regions, and the third region extends in the predetermined direction, the third region is located between the fourth regions, and the diffraction grating layer is provided on the third region. The semiconductor optical amplifier further comprises a semiconductor layer of the second conductive type, and the semiconductor layer of the second conductive type is provided on the fourth region, and the semiconductor layer of the second conductive type has a bandgap energy greater than that of the diffraction grating layer.

The semiconductor optical amplifier according to the present invention further comprises a lower electrode, a first upper electrode, and a second upper electrode. The lower cladding layer, the active layer and the upper cladding layer are provided between the lower electrode and the first upper electrode, and the second upper electrode is electrically isolated from the first upper electrode. The lower cladding layer and the semiconductor layer of the second conductive type is provided between the lower electrode and the second upper electrode.

In the semiconductor optical amplifier according to the present invention, the first region of the lower cladding layer has a fifth region and a sixth region, and the fifth region extends in the predetermined direction. The fifth region is provided between the sixth regions, the active layer is provided on the fifth region, and the upper cladding layer is provided on the sixth region and the active layer.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

DESCRIPTION OF THE PREFERRED EMBODIMENTS

The teachings of the present invention will readily be understood in view of the following detailed description with reference to the accompanying drawings illustrated by way of example. When possible, parts identical to each other will be referred to with reference symbols identical to each other.

First Embodiment

Figure 1:
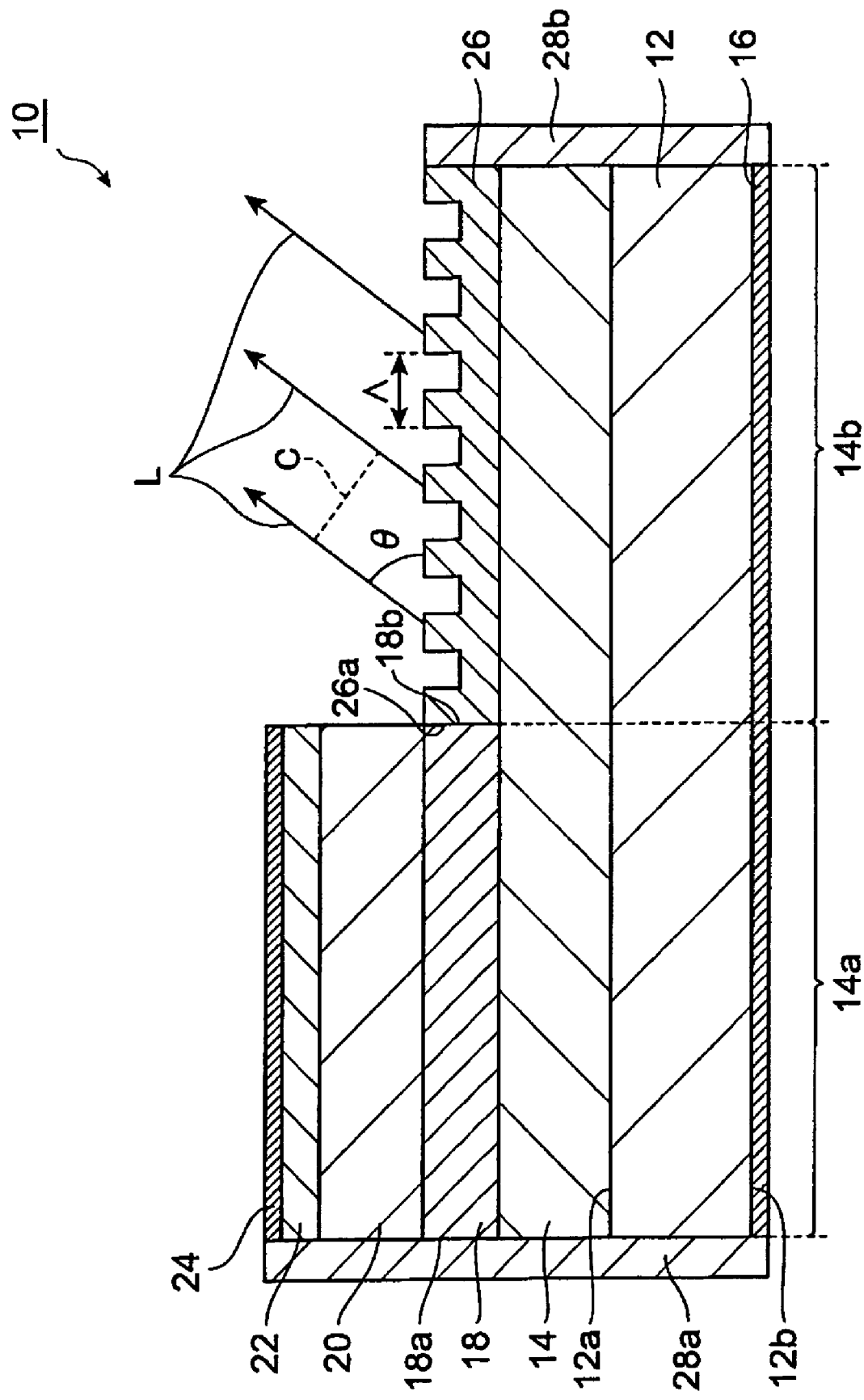
FIG. 1 is a cross sectional view showing a semiconductor optical amplifier according to the first embodiment of the present invention.

FIG. 1 is a cross sectional view partly in section showing a semiconductor optical amplifier according to the first embodiment of the present invention. The cross section in FIG. 1 is taken along an optical propagating direction in which light propagates in an active layer of the semiconductor optical amplifier.

Referring to FIG. 1, a semiconductor optical amplifier 10 includes a substrate 12, a lower cladding layer 14, a lower electrode 16, an active layer 18, an upper cladding layer 20, a contact layer 22, an upper electrode 24 a diffraction grating layer 26 and anti-reflection coatings 28a and 28b.

The substrate 12 is an n-type semiconductor substrate in the present embodiment. The lower cladding layer 14 is provided on a primary surface 12a of the substrate 12, and the lower electrode 16 is provided on the backside 12b of the substrate 12. The substrate 12 is heavily doped with the same conductive type dopant as that of the lower cladding layer 14. The substrate 12 forms an ohmic contact with the lower electrode 16.

The lower cladding layer 14 is a n-type cladding layer in the present embodiment. The cladding layer 14 has a primary surface including a first region 14a and a second region 14b. The first and second regions 14a and 14b is sequentially arranged along a predetermined axis. The predetermined axis extends in the propagating direction in which light propagates in the active layer 18 of the semiconductor optical amplifier 10.

The upper cladding layer 20 is provided on the first region 14a and the active layer 18 is provided between the upper cladding layer 20 and the first region 14a of the lower cladding layer 14. The active layer 18 has a first end 18a and a second end 18b. The first end 18a receives external optical input signals and the second end 18b emits amplified optical output signals.

The active layer 18 has a bulk structure, a single quantum well structure or a multiple quantum well structure that includes well layers and barrier layers arranged alternately. The active layer 18 may be undoped, and, if required, may be doped with appropriate dopants.

The upper cladding layer 20 is a p-type cladding layer in the present embodiment. The upper cladding layer 20 may be doped with a p-conductive type dopant. A contact layer 22 is provided on the upper cladding layer 20.

The contact layer 22 is heavily doped with a dopant of the same conductive type as that of the cladding layer 20. The electrode 24 is provided on the contact layer 22. The contact layer 22 and upper electrode 24 form an ohmic contact.

The semiconductor optical amplifier 10 amplifies optical signals in the following way. The active layer 18 is made of material having a bandgap energy lower than that of the lower and upper cladding layers 14 and 20, and thus carriers injected into the active layer 18 are confined into the active layer 18. Then, when an external optical signal having a center wavelength $\lambda$ is inputted into the active layer 18, carriers in the active layer 18 are recombined intensively by stimulated emission due to the inputted optical signal, which increases the optical gain in the active layer 18. The input optical signal is coherently amplified by this optical gain, and amplified optical signal is emitted at the second end 18b. The active layer 18 also generates amplified spontaneous emission light due to spontaneous emission phenomenon in addition to the amplified optical signal generated by stimulated emission. The amplified spontaneous emission light are superposed on the amplified optical signal and acts as noise components. Consequently, light including the amplified optical signal and the amplified spontaneous emission light is emitted at the second end 18b of the active layer 18.

Returning to FIG. 1, the diffraction grating layer 26 is provided on the second region 14b of the lower cladding layer 14. The diffraction grating layer 26 has a diffraction grating provided along the predetermined axis. The diffraction grating layer 26 has a first end 26a optically coupled to the second end 18b. In the present embodiment, the period $\Lambda$ of a diffraction grating in the diffraction grating layer 26 is constant. In order to avoid the absorption of the amplified optical signal, the diffraction grating layer 26 has a bandgap energy greater than an energy corresponding to the wavelength of the amplified optical signal. In order to obtain a good optical coupling between the active layer 18 and the diffraction grating layer 26, it is preferable that the diffraction grating layer 26 have a cross section similar to that of the active layer 18 and that the second end 18b of the active layer 18 is in abutting contact with the first end 26a of the diffraction grating layer 26 such that the whole end face of the active layer 18 is substantially covered with the end face of the diffraction grating layer 26.

A protecting layer may be provided on the diffraction grating layer 26, and, in order to prevent the absorption of the transmitted light in the protecting layer, it is made of material transparent to light coming from the diffraction grating layer 26. Examples of the material of the protecting layer are: SiN, $SiO_2$, $Al_2O_3$ and so on.

Anti-reflecting coatings 28a and 28b are provided on the both ends of the semiconductor optical amplifier 10, respectively. The anti-reflecting coatings 28a and 28b are used to suppress laser oscillation by decreasing optical reflection at both ends 28a and 28b, and permits the semiconductor optical amplifier 10 to operate as an optical amplifying device. The anti-reflecting coatings 28a and 28b are made of SiN, for example.

Materials of the layers in the semiconductor optical amplifier 10 using a GaAs substrate for the substrate 12 are listed below:
lower cladding layer 14: GaInP
lower electrode 16: AuGeNi
active layer 18: GaInNAs
upper cladding layer 20: GaInP
contact layer 22: GaAs
upper electrode 24: TiPtAu
diffraction grating layer 26: GaAs.

Materials of the layers in the semiconductor optical amplifier 10 using an InP substrate for the substrate 12 are listed below:
lower cladding layer 14: InP
lower electrode 16: AuGeNi
active layer 18: GaInAsP or GaInAs
upper cladding layer 20: InP
contact layer 22: GaInAsP or GaInAs
upper electrode 24: TiPtAu
diffraction grating layer 26: GaInAsP.

The way of the outputting the amplified signal from the diffraction grating layer 26 will be described below. Light from the second end 18b of the active layer 18 is incident on the first end 26a of the diffraction grating layer 26.

Among the amplified optical signals incident on the first end 26a of the diffraction grating layer 26, the amplified signal L having the center wavelength λ is diffracted at the angle of θ to the optical propagating direction (the above predetermined axial direction) according to the Bragg diffraction condition as expressed in the following equation:

$$n_e\Lambda - n_1\Lambda \cos(\theta) = \Lambda(n_e - n_1 \cos(\theta)) = m\lambda \quad (1)$$

where symbol $\Lambda$ corresponds to the period of the diffraction grating in the diffraction grating layer 26; symbol $n_e$ corresponds to an effective refractive index to the signal light propagating in the diffraction grating layer 26; symbol $n_1$ corresponds to the refractive index in a region to which the diffracted signal light is emitted propagates from the diffraction grating layer 26; symbol m is integer.

For example, when the effective refractive index $n_e$ of the diffraction grating in the diffraction grating layer 26 is 3.4 and the refractive index of the above region to which the diffracted signal light is emitted from the diffraction grating layer 26 is 1.0, an amplified optical signal L having the center wavelength of 1310 nanometers is diffracted at the angle of θ=90 degrees by using the diffraction grating having the period $\Lambda$ of 385.3 nanometers. This diffraction grating of the above period can be easily fabricated by use of well-known manufacturing apparatuses, such as an interference exposure apparatus and electron beam (EB) exposure apparatus, and there is no technical barrier against the fabrication process thereof.

The technical advantages and contributions will be described below. Light diffracted to the direction defined by the angle θ contain only the wavelength components around the center wavelength λ, i.e. only the components in the wavelength region of the amplified signal light L. Wavelength components outside this wavelength region do not satisfy the Bragg diffraction condition and thus they are not diffracted by the diffraction grating, and are emitted through the second end 26b of the diffraction grating layer 26. Consequently, the semiconductor optical amplifier 10 can eliminate the amplified spontaneous emission light outside the wavelength region of the signal light L and can selectively emit only the amplified signal light L at the angle θ.

As mentioned above, the semiconductor optical amplifier 10 reduces the amplified spontaneous emission light in the output light without using another filter and so on. In addition, a large number of the semiconductor optical amplifiers 10 can be produced in one fabrication process by use of general semiconductor manufacturing apparatuses. Accordingly, the semiconductor optical amplifier 10 can reduce the cost. Further, since the semiconductor optical amplifier 10 integrates monolithically an amplifying portion for amplifying the light with a diffracting portion for eliminating the amplified spontaneous emission and has the size of hundreds of micrometers, the semiconductor optical amplifier 10 is small-sized. Therefore, the semiconductor optical amplifier 10 can prevent the increase of system size due to the additional external filters which has been a serious problem in the conventional optical communication systems.

Second Embodiment

Figure 2:
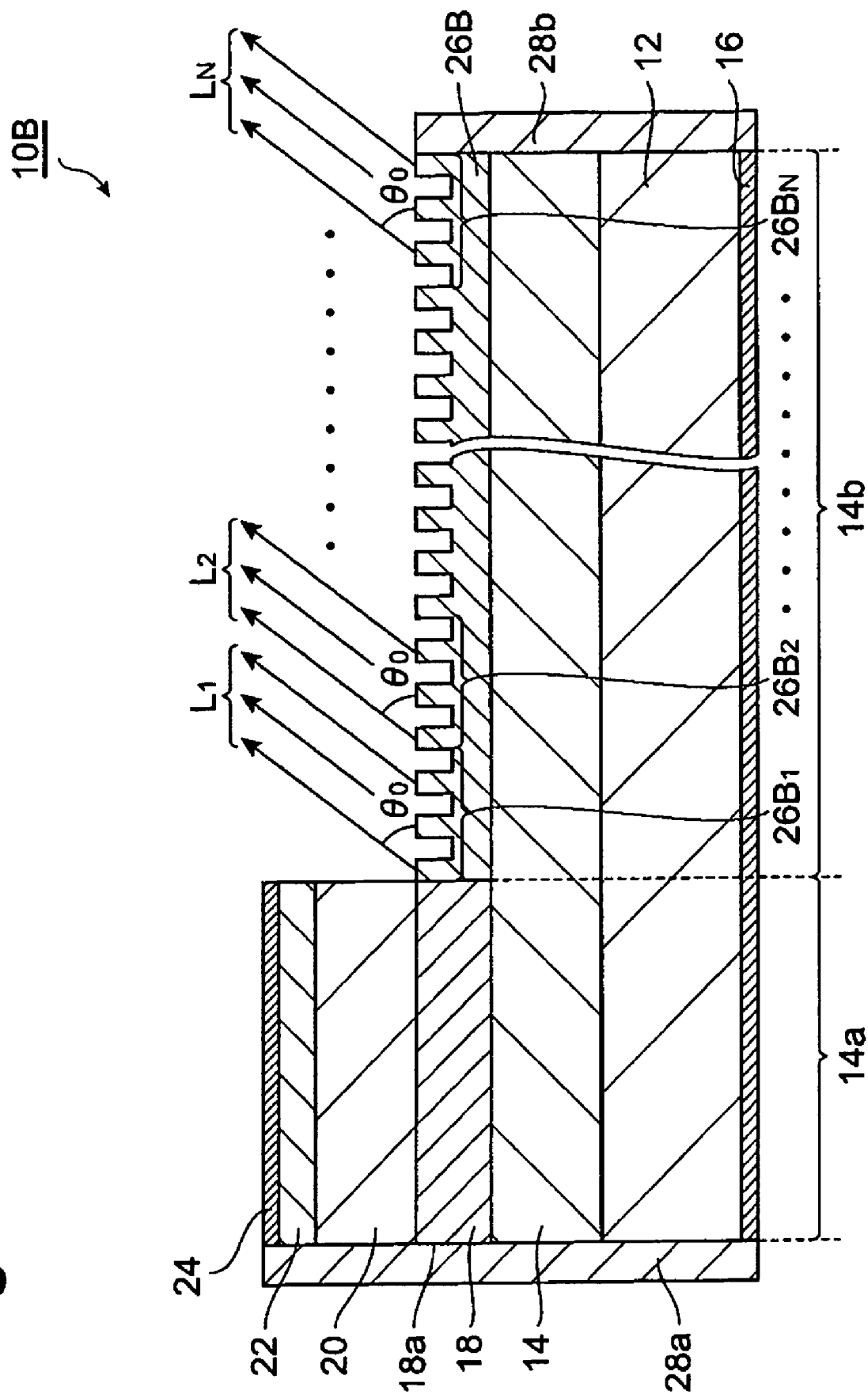
FIG. 2 is a cross sectional view showing a semiconductor optical amplifier according to the second embodiment of the present invention.

FIG. 2 is a cross sectional view showing a semiconductor optical amplifier according to the second embodiment of the present invention. The cross section in FIG. 2 is taken along an optical propagating direction in which light propagates in an active layer of the semiconductor optical amplifier. In the subsequent explanation, the details of a semiconductor optical amplifier 10B that are different from the semiconductor optical amplifier 10 will be described.

A diffraction grating 26B of the semiconductor optical amplifier 10B has a number of portion $26B_1$ to $26B_N$ provided along the predetermined direction (the optical propagating direction in which light propagates in an active layer of the semiconductor optical amplifier). The suffix "N" takes an integer that is greater than two.

The grating period of each of portions $26B_1$ to $26B_N$ is different from each other. In the present embodiment, the grating period $\Lambda$i (i=1 to N) is set to satisfy the equation:

$$\Lambda i = m\lambda i/(n_e - n_1 \cos(\theta_0)) \quad (2)$$

where "m" takes an integer; symbol "$n_e$" corresponds to an effective refractive index for a signal light propagating in the diffraction grating layer; symbol "$n_1$" corresponds to a refractive index of a region to which light diffracted from the diffraction grating layer 26B is emitted; symbol "λi" (i=1 to N) correspond to the center wavelength of the light which is diffracted from each portion $26B_i$; symbol "$\theta_0$" corresponds to the Bragg reflection angle of light measured from the above predetermined direction.

The grating periods of the portions $26B_1$ to $26B_N$ are set such that the portions $26B_1$ to $26B_N$ diffract corresponding signal lights in the same direction, and the wavelengths of the diffracted lights in these portions are different from each other. This direction is the same as a direction defined above by the Bragg reflection angle $\theta_0$. More specifically, light $L_1$ having a wavelength component $\lambda_1$ is diffracted by the portion $26B_1$ in the direction defined by the above angle $\theta_0$; light $L_2$ having a wavelength component $\lambda_2$ is diffracted by the portion $26B_2$ in the direction defined by the above angle $\theta_0$; light $L_N$ having a wavelength component $\lambda_N$ is diffracted by the portion $26B_N$ in the direction defined by the above angle $\theta_0$.

For example, when the effective refractive index $n_e$ of the diffraction grating layer is 3.4, and the refractive index of the region (air) to which light diffracted from the grating layer is emitted is 1.0, the amplified light $L_1$ of the center wavelength component of 1290 nm, the amplified light $L_2$ of the center wavelength component of 1313 nm, and the amplified light $L_3$ of the center wavelength component of 1330 nm are diffracted in the direction defined by the angle $\theta_0$ of 90 degrees, by setting grating periods $\Lambda_1$, $\Lambda_2$ and $\Lambda_3$ of the portions $26B_1$, $26B_2$, $26B_3$ to be 378.4 nm, 385.3 nm and 391.2, respectively.

In addition to technical advantages provided by the semiconductor optical amplifier 10, the semiconductor optical amplifier 10B can diffract amplified signal lights in different wavelength values in the same direction while eliminating amplified spontaneous emission light outside the above wavelength region of each signal light. Therefore, an optical network using the semiconductor optical amplifier 10B does not need filters the number of which corresponds to the number of signal lights and does not need a controlling apparatus for arranging these filters in the transmission line. For example, when the semiconductor optical amplifier 10B is used in a system in which N signal lights of the wavelength values different from each other are transmitted, but only one signal is transmitted during one transmission, all transmitted signal lights are emitted from the semiconductor optical amplifier 10B in the same direction and therefore can be received by a single optical receiver, thereby reducing the cost of the receiver.

Third Embodiment

Figure 3:
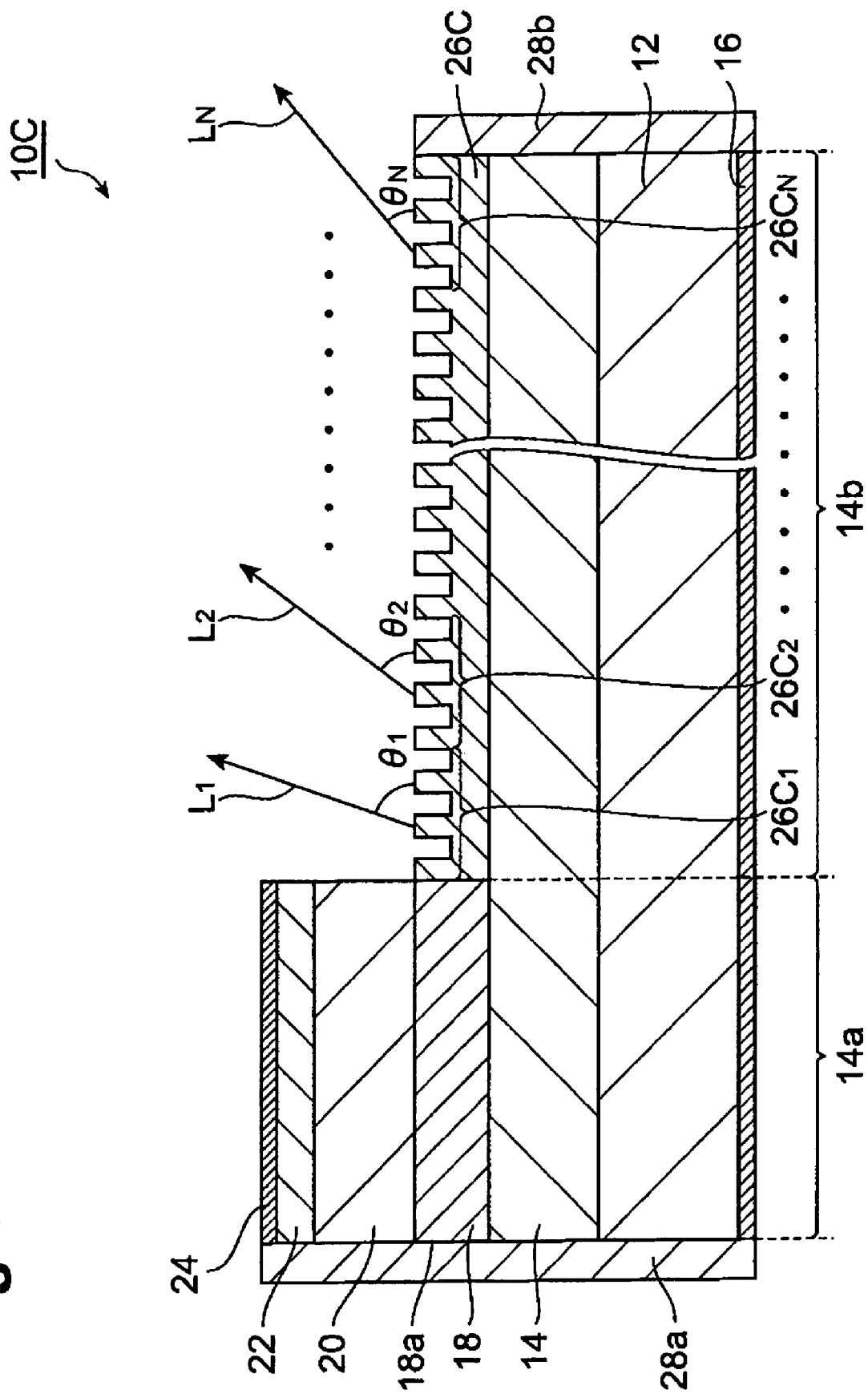
FIG. 3 is a cross sectional view showing a semiconductor optical amplifier according to the third embodiment of the present invention.

FIG. 3 is a cross sectional view showing a semiconductor optical amplifier according to the third embodiment of the present invention. The cross section in FIG. 3 is taken along an optical propagating direction in which light propagates in an active layer of the semiconductor optical amplifier. In the subsequent explanation, the details of a semiconductor optical amplifier 10C that are different from the semiconductor optical amplifier 10B will be described.

A diffraction grating layer 26C of the semiconductor optical amplifier 10C has a number of portion $26C_1$ to $26C_N$ provided along the predetermined direction (the optical propagating direction in which light propagates in an active layer of the semiconductor optical amplifier). The suffix "N" takes an integer that is two or more.

The grating periods of each of portions $26C_1$ to $26C_N$ are different from each other. In the present embodiment, the grating period $\Lambda i$ (i=1 to N) is set to satisfy the equation:

$$\Lambda i = m\lambda i/(n_e - n_1 \cos(\theta_i)) \quad (3)$$

where "m" takes an integer; symbol "$n_e$" corresponds to an effective refractive index for a signal light propagating in the diffraction grating layer; symbol "$n_1$" corresponds to a refractive index of a region to which light diffracted from the diffraction grating layer is emitted; symbol "$\lambda i$" (i=1 to N) correspond to the center wavelength of the light which is diffracted from the portion $26C_i$, respectively; symbol "$\theta_i$" corresponds to a Bragg reflection angle of light for each portion $26C_i$ measured from the above predetermined direction.

The grating periods of the portions $26C_1$ to $26C_N$ are set such that they diffract the signal lights of the center wavelength values $\lambda_1$ to $\lambda_N$ to directions $\theta_1$ to $\theta_N$, respectively. These center wavelength values are different from each other, and these diffraction directions are different from each other. More specifically, light $L_1$ having a wavelength component $\lambda_1$ is diffracted by the portion $26C_1$ in the direction defined by the above angle $\theta_1$; light $L_2$ having a wavelength component $\lambda_2$ is diffracted by the portion $26C_2$ in the direction defined by the above angle $\theta_2$; light $L_N$ having a wavelength component $\lambda_N$ is diffracted by the portion $26C_N$ in the direction defined by the above angle $\theta_N$.

For example, when the effective refractive index $n_e$ of the diffraction grating is 3.4, and the refractive index of the region (air) to which light propagating in the diffraction grating layer is diffracted is 1.0, the amplified light $L_1$ of the center wavelength component $\lambda_1$ of 1290 nm is diffracted in the direction defined by the above angle of 30 degrees, the amplified light $L_2$ of the center wavelength component $\lambda_2$ of 1313 nm is diffracted in the direction defined by the above angle of 60 degrees, and the amplified light $L_3$ of the center wavelength component $\lambda_3$ of 1330 nm is diffracted in the direction defined by the above angle of 90 degrees, by setting grating periods $\Lambda 1$, $\Lambda 2$ and $\Lambda 3$ of the portions $26C_1$, $26C_2$ and $26C_3$ to be 509.1 nm, 451.7 nm and 391.2 nm, respectively.

In addition to technical advantages provided by the semiconductor optical amplifier 10, the semiconductor optical amplifier 10C can diffract amplified signal lights in different wavelength regions in different directions while eliminating the spontaneous emission light outside the wavelength region of the each signal light. Therefore, these signal lights from the semiconductor optical amplifier 10C can be received by use of a number of optical receivers corresponding to respective signal lights. For example, when the semiconductor optical amplifier 10C is used in a system that transmits multiplexed signal lights of the wavelengths different from each other, the semiconductor optical amplifier 10C does not need to have optical elements, such as filters the number of which corresponds to the number of optical signals and an optical demultiplexer, for demultiplexing optical signals of different wavelengths, thereby reducing the cost of the system and avoiding the enlargement of the system.

Fourth Embodiment

Figure 4:
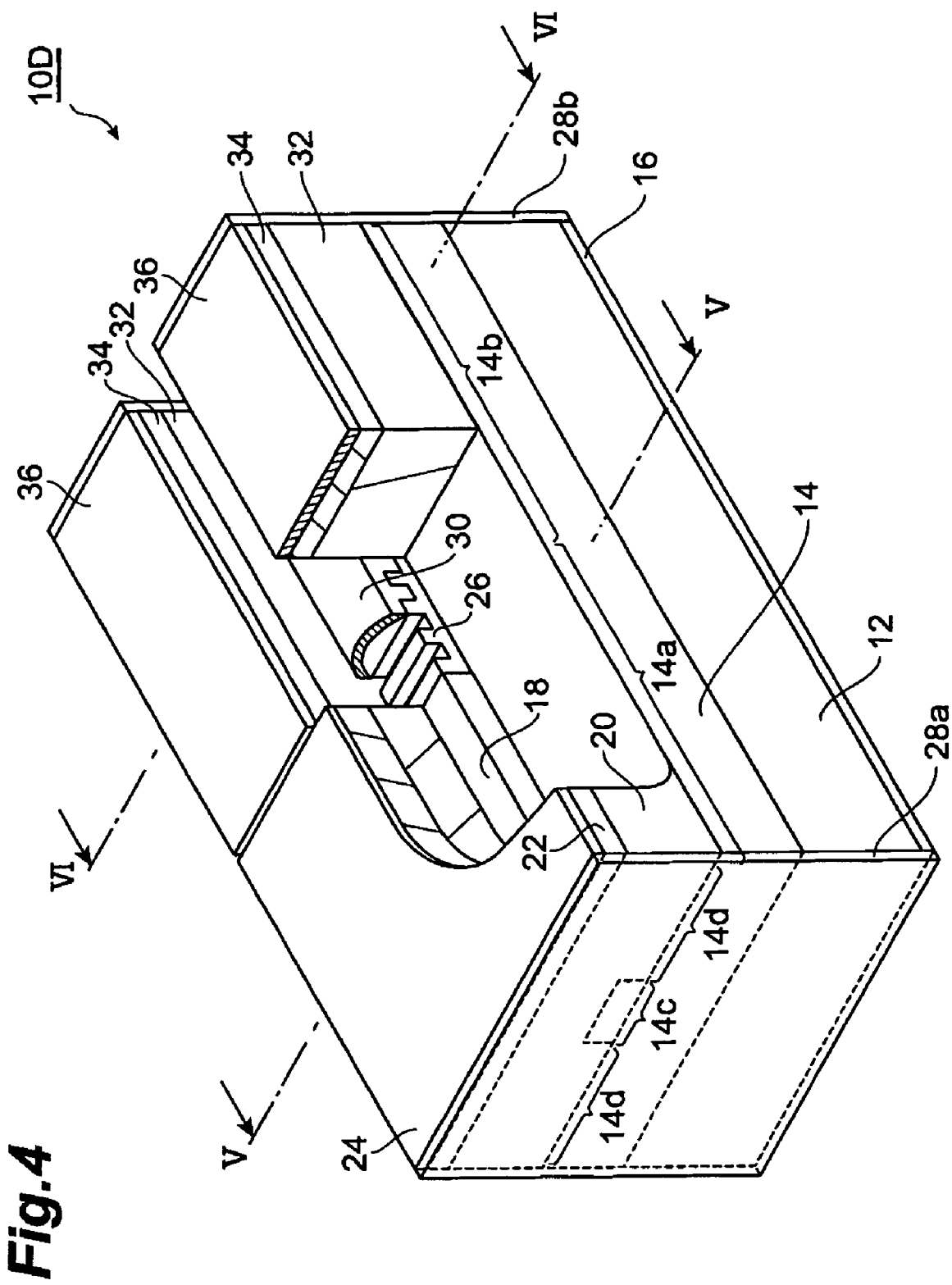
FIG. 4 is a perspective view, partly in section, showing a semiconductor optical amplifier according to the fourth embodiment of the present invention.
Figure 5:
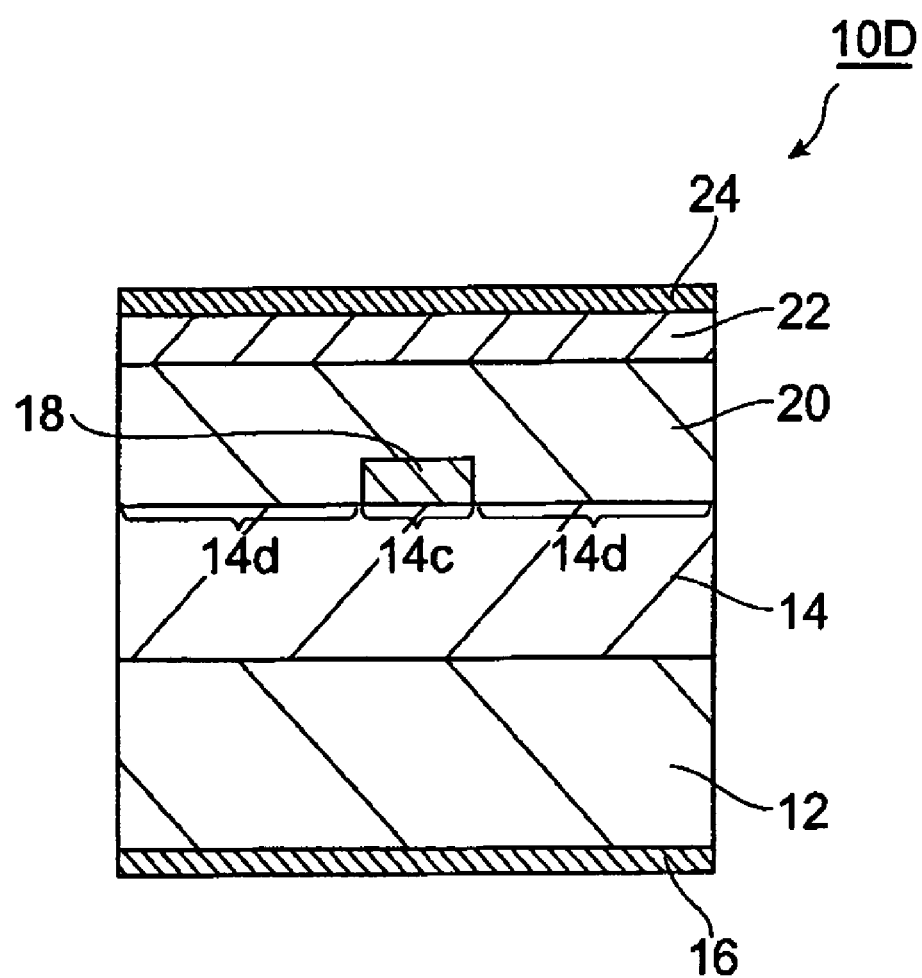
FIG. 5 shows a cross sectional view taken along V-V line in FIG. 4.
Figure 6:
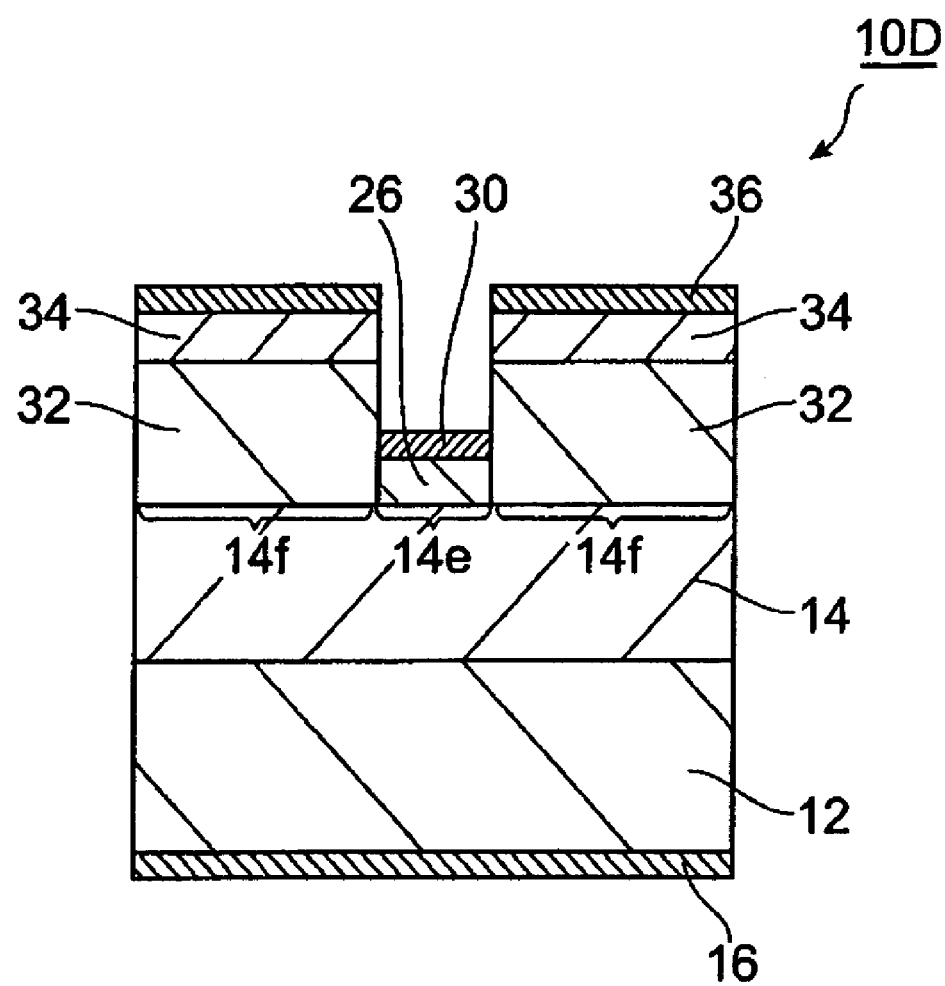
FIG. 6 shows a cross sectional view taken along VI-VI line in FIG. 4.

FIG. 4 is a perspective view, partly exploded, showing a semiconductor optical amplifier according to the fourth embodiment of the present invention. FIG. 5 is a cross sectional view taken along V-V line in FIG. 4. FIG. 6 is a cross sectional view taken along VI-VI line in FIG. 4. In the subsequent explanation, the details of a semiconductor optical amplifier 10D shown in FIGS. 4 to 6 that are different from the semiconductor optical amplifiers 10, 10B, 10C will be described.

As shown in FIGS. 4 and 5, the region 14a of the semiconductor optical amplifier 10D has a region 14c (a fifth region) and regions 14d (sixth regions). This region 14c extends in a predetermined direction, for example, the direction in which light in the active layer propagates. The region 14c are provided between the regions 14d.

The region 14c supports the active layer 18 having a mesa shape. The upper cladding layer 20 is provided on the active layer 18 and the regions 14d. The bandgap energy values of the lower cladding layer 14 and the upper cladding layer 20 are greater than the bandgap energy value of the active layer 18. The refractive index values of the lower cladding layer 14 and the upper cladding layer 20 are smaller than the refractive index value of the active layer 18. The width of the active layer 18 is not more than five micrometers for satisfying the requirement of single lateral mode for propagating signal light. A contact layer 22 is provided on the upper cladding layer 20. An upper electrode 24 is provided on the contact layer 22. The lower electrode 16 is provided on the backside of the substrate 12.

The turn-on voltage of a pin junction portion constituted by the upper cladding layer 20, the active layer 18 and the lower cladding layer 14 is determined by the built-in potential of this pin junction portion. This built-in potential of the pin junction portion is mainly determined by the bandgap energy of the active layer.

The turn-on voltage of a pn junction portion constituted by the upper cladding layer 20 and the lower cladding layer 14 is determined by the built-in potential of this pn junction portion. This built-in potential of the pn junction portion is mainly determined by the bandgap energy of the lower and upper cladding layers.

In the semiconductor optical amplifier 10D, since the bandgap energy values of the upper and lower cladding layers 14, 20 are greater than the bandgap energy value of the active layer 18, the built-in potential of the pn junction is greater than that of the pin junction. Accordingly, the difference between the built-in potential of the pn junction portion and the built-in potential of the pin junction portion can be utilized to confine current (carriers) into the active layer.

Mechanism for the current confinement will be explained in the following. The built-in potential of the pn junction portion is greater than that of the pin junction portion, and this means that the turn-on voltage of the pn junction portion is higher than that of the pin junction portion. The greater the built-in potential difference between the pn junction portion and the pin junction portion is, the greater the turn-on voltage difference between the pn junction portion and the pin junction portion is. In other words, the turn-on voltage difference is increased as the bandgap difference between the active layer and the lower and upper cladding layers becomes large.

When the driving voltage is gradually increased from zero volt, the pin junction portion having a smaller turn-on voltage is primarily turned on. Then the resistance of the turned-on pin junction portion becomes low and current flows through the turned-on pin junction portion. Consequently, a large amount of carriers are supplied to the active layer, and recombined to generate light in the active layer 18. Since the pn junction portion has not been turned on yet, the resistance of the pn junction portion still remains high. Therefore, the current (carriers) is effectively blocked by the pn junction portion and is confined into the pin junction portion, i.e., the active layer.

Further, since the refractive index value of the active layer 18 is larger than the refractive index values of the upper and lower cladding layers surrounding it, light generated in the active layer is confined into the active layer and its vicinity. Thus, both current and light can be effectively confined into the active layer. Therefore, effective stimulated emission is caused in the active layer 18 and inputted optical signals can be effectively amplified.

As shown in FIGS. 4 and 6, the semiconductor optical amplifier 10D has a structure capable of injecting current into the diffraction grating layer 26. Specifically, the region 14b of the lower cladding layer 14 has a region 14e (a third region) and regions 14f (fourth regions). The region 14e is connected to the region 14c and extend in the above predetermined direction. The region 14e is between the regions 14f.

The diffraction grating layer 26 is provided on the region 14e. A semiconductor layer 32 of the p conductive type is provided on the regions 14f. The semiconductor layer 32 is connected to the upper cladding layer 20, and is made of the same material as the upper cladding layer 20. A contact layer 34 is provided on the semiconductor layer 32, and an upper electrode 36 is provided on the contact layer 34. The upper electrode 36 is made of the same material as the upper electrode 24 and the contact layer 34 is made of the same material as the contact layer 22. The lower electrode 16 is provided on the backside of the substrate 12.

A groove is provided in the following arrangement: between the contact layer 22 and the contact layer 34 and between the upper electrode 24 and the upper electrode 36, which makes it possible to electrically isolate the active layer 18 from the diffraction grating layer 26. As a result, the current injections into the active layer 18 and the diffraction grating layer 26 can be controlled independently each other. If a further isolation therebetween is required, another groove may be also formed between the upper cladding layer 20 and the semiconductor layer 32.

In order not to prevent diffracted signal light components from being emitted to the outside region, only the protecting layer 30 is provided on the diffraction grating layer 26. The protecting layer 30 works as a protector for protecting the diffraction grating layer 26 from process damages, damages due to mechanical forces and crystal degradation during the long-term use of the device. The protecting layer 30 is made of transparent material that does not absorb the signal light. For example, the protecting layer 30 is made of dielectric films, such as SiN, $SiO_2$, $Al_2O_3$ and so on. The protecting layer 30 can be omitted if the device can operate without it.

In order to prevent the diffraction grating layer from absorbing the amplified signal light, the material of the diffraction grating layer 26 has a bandgap energy higher than the energy that corresponds to the wavelength of the amplified optical signal. Further, in order to confine current and light into the diffraction grating layer 26 as will be described later, the bandgap energy of the diffraction grating layer 26 is smaller than those of the lower cladding layer 14 and the semiconductor layer 32 and has a refractive index value higher than those of the lower cladding layer 14 and the semiconductor layer 32.

Current (carriers) is injected into the diffraction grating layer 26 through the semiconductor layer 32 provided on both sides of the diffraction grating layer 26. The width of the diffraction grating layer 26 is not more than five micrometers in order to maintain the single lateral mode of propagating optical signals. Therefore, considering that diffusion lengths of carriers are 2 to 3 micrometers or so, the carrier density in the diffraction grating layer 26 is approximately kept to be constant by the carrier different from the semiconductor layer 32 to the diffraction grating layer 26.

The turn-on voltage of the current confinement portion constituted by the semiconductor layer 32, the diffraction grating layer 26 and the lower cladding layer 14 is determined by the built-in potential of the current confinement portion that mainly depends on the bandgap of material of the diffraction grating layer 26. The turn-on voltage of the pn junction portion constituted by the semiconductor layer 32 and the lower cladding layer 14 is determined by the built-in potential of the pn junction portion that mainly depends on the bandgap energy of the semiconductor layer 32 and the lower cladding layer 14.

In the semiconductor optical amplifier 10D, since the bandgap energies of the lower cladding layer 14 and the semiconductor 32 are greater than the bandgap energy value of the diffraction grating layer 26, the turn-on voltage of the pn junction portion is greater than that of the current confinement portion. By use of the difference between these turn-on voltages, current (carriers) can be confined into the diffraction grating layer 26.

Since the refractive index of the diffraction grating layer 26 is greater than the refractive indices of the semiconductor layer 32 and the lower cladding layer 14, the amplified signal light from the active layer 18 is confined in the diffraction grating layer 26 and propagates therein, and it is effectively reflected by the diffraction grating therein during the propagation.

The current confinement structures for the active layer 18 and the diffraction grating layer 26 have advantages over conventional current confinement structures. Conventionally, when current is confined into a mesa-shaped active layer and diffraction grating layer, so-called buried hetero-structures (BH) are used. Conventional current BH structures are formed as follows: current block regions in which semiconductor layers of a different conductive type are stacked alternately are grown on the both sides of the mesa-shaped active layer and diffraction grating layer to form pn junctions; at least one of the pn-junctions biased reversely can block the current flow. But, since the additional growth of the current block regions is needed for forming the BH current confinement structures, there are a number of disadvantages that: the number of epitaxial growth steps is increased; its manufacturing process is complex.

On the contrary, since the semiconductor optical amplifier 10D does not need any current block layers, the number of the growth steps and manufacturing process steps become shortened as compared to the conventional BH structures, thereby reducing the manufacturing cost.

Furthermore, the semiconductor optical amplifier 10D has the following advantages in addition to the advantages provided by the semiconductor optical amplifiers according to the first to third embodiments because in the semiconductor optical amplifier 10D current injection into the diffraction grating is possible.

That is, in the present structure, amplified signal light is diffracted to the direction that satisfies the Bragg condition, and symbol θ for the diffraction angle is expressed by the following equation:

$$\theta = \arccos((n_e - m\lambda/Y)/n_1) \qquad (4).$$

The meanings of the symbols in Eq. (4) are already explained in equation (1), (2) and (3).

When current (carriers) is injected into the diffraction grating layer 26, the refractive index is changed by the injected current due to the plasma effect and so on. Therefore, the effective refractive index $n_e$ for the signal light propagating in the diffraction grating layer 26 is changed in accordance with the above refractive index change in the diffraction grating layer 26. As seen from the equation (4), changes in the effective refractive index $n_e$ changes the angle θ. In the semiconductor optical amplifier 10D, the output direction for the amplified signal light, i.e., angle θ, is changed in accordance with the quantity of the current injected into the diffraction grating layer 26, and therefore the semiconductor optical amplifier 10D works as a diffraction angle tunable Bragg reflector in which the diffraction angle can be controlled by the quantity of current injected into the diffraction grating layer 26.

According to the semiconductor optical amplifier 10D, if necessary, the output direction (angle θ) of the amplified signal light can be changed by injecting current into the diffraction grating layer. Further, even when the wavelength of the amplified signal light varies, the output direction (angle θ) of the amplified signal light can be kept constant by controlling current injected into the diffraction grating layer 26.

Even when the semiconductor optical amplifier 10D has a diffraction grating of the period slightly deviated from a desired design value, the output direction (angle θ) of the amplified signal light can be adjusted to the desired value by controlling current injected into the diffraction grating layer in accordance with the equation (4). Therefore, according to the semiconductor optical amplifier 10D, the diffraction angle can be adjusted to a desired value, even if the period of the diffraction grating is fluctuated in the actual fabrication. Therefore, the acceptable limit of the period fluctuation of the diffraction grating is widened, thereby improving its yield and reducing the manufacturing cost. The current injecting structure for injecting current into the diffraction grating layer 26 in the semiconductor optical amplifier 10D can be used in the semiconductor optical amplifiers in all of the first to third embodiments.

Figure 7:
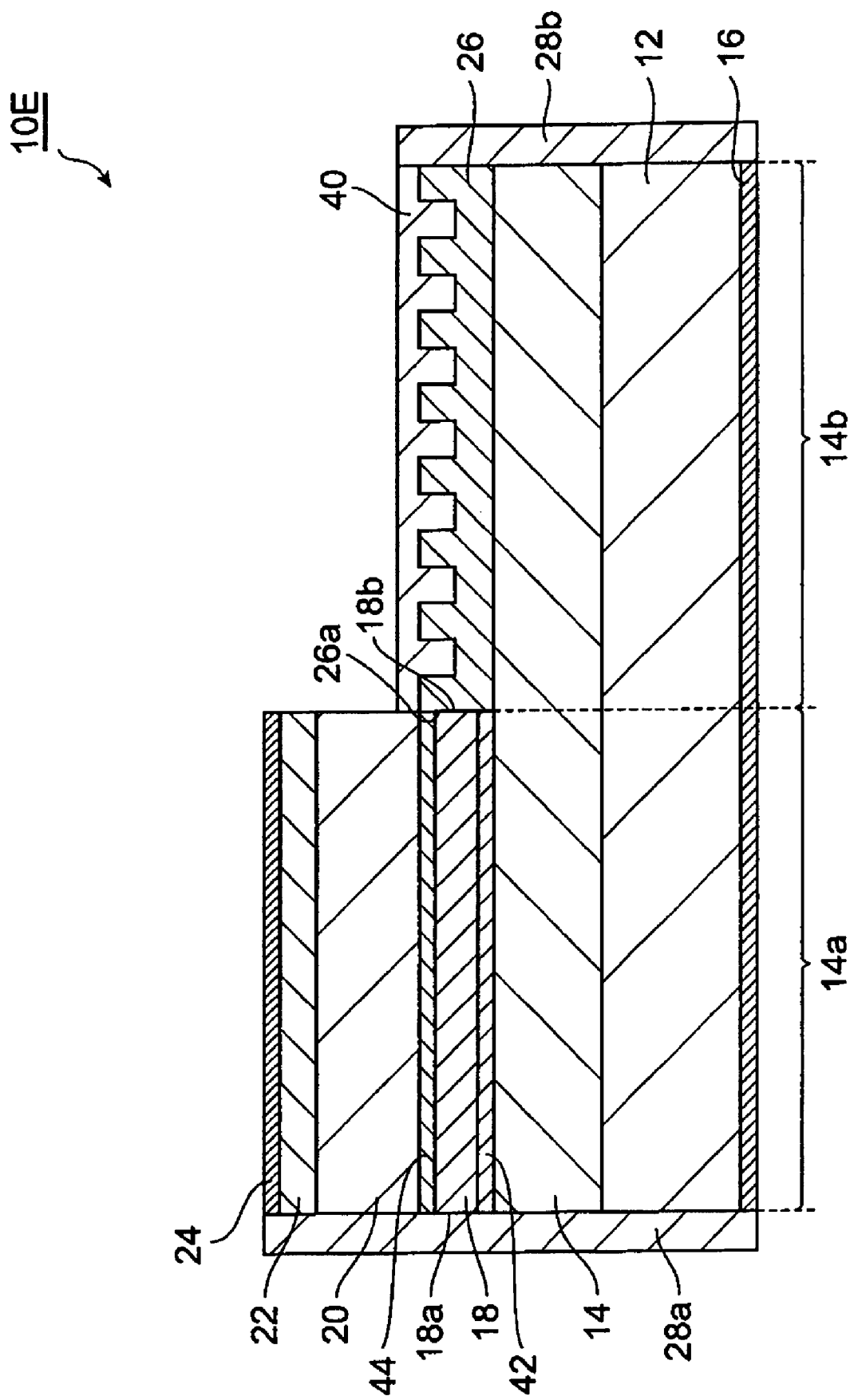
FIG. 7 is a cross sectional view showing a semiconductor optical amplifier according to another embodiment of the present invention.

Having described and illustrated the first to fourth embodiments of the semiconductor optical amplifiers according to the invention, the application of the present invention is not limited thereto. Details of structures of these devices can be modified as necessary. FIG. 7 is a cross sectional view showing a semiconductor optical amplifier according to another embodiment. The cross section in FIG. 7 is taken along an optical propagating direction in which light propagates in an active layer of the semiconductor optical amplifier.

A semiconductor optical amplifier 10E shown in FIG. 7 has a reflection controlling layer 40. Diffracted light from the diffraction grating layer 26 includes one component that goes to the upper region (to the reflection controlling layer 40) of the diffraction grating layer 26 and another component that goes to the lower region (to the lower cladding layer 14) of the diffraction grating layer 26. The power ratio of one component to another one depends on the refractive indices of the reflection controlling layer 40 and the lower cladding layer 14. In other words, when the reflection controlling layer 40 is made of material of a refractive index lower than that of the lower cladding layer 14, the power of the component of the diffracted light going to the lower cladding layer 14 is larger than that of another component going to the reflection controlling layer 40. Reversely, when the reflection controlling layer 40 is made of material of a refractive index higher than that of the lower cladding layer 14, the power of the component of the diffracted light going to the lower cladding layer 14 is smaller than that of another component going to the reflection controlling layer 40. The refractive index of the reflection controlling layer 40 can be changed easily by changing its composition. Therefore, the output power of the diffracted signal light going to the upper region can be controlled adequately according to the system requirements.

Since the reflection controlling layer 40 can change adequately the output power of the amplified signal light to optical receivers according to the system requirements, the design flexibility of optical receiver systems can be increased.

For example, dielectric films, such as SiN, $Al_2O_3$ or $SiO_2$ can be used for the reflection controlling layer 40. The reflection controlling layer 40 made of one of these materials can also work as a protecting layer.

Furthermore, the semiconductor optical amplifier 10E further comprises a first optical confinement layer 42 and a second optical confinement layer 44. The first optical confinement layer 42 is provided between the active layer 18 and the lower cladding layer 14, and the second optical confinement layer 44 is provided between the active layer 18 and the upper cladding layer 20. The first optical confinement layer 42 has a bandgap energy between that of the active layer 18 and that of the lower cladding layer 14, and the second optical confinement layer 44 has a bandgap energy between that of the active layer 18 and that of the upper cladding layer 20.

If the first optical confinement layer 42 and the second optical confinement layer 44 are used in the semiconductor optical amplifier 10E, the bandgap energy diagram is lowered from the upper and lower cladding layers 14, 20 to the active layer 18. Thus, carriers are not trapped by energy barriers due to built-in potentials thereamong and are effectively injected from the upper and lower cladding layers 14, 20 to the active layer 18 through the first and the second optical confinement layers 42 and 44. The injected carriers are confined by the built-in potentials between the first and the second optical confinement layers 42 and 44 and the active layer 18.

The first optical confinement layer 42 has a refractive index between that of the active layer 18 and that of the lower cladding layer 14, and the second optical confinement layer 44 has a refractive index between that of the active layer 18 and that of the upper cladding layer 20.

As seen from the above explanation, the upper and lower cladding layers 14, 20 has a function to confine light generated in the active layer 18 to the first and the second optical confinement layers and the active layer 18. Using the first and the second optical confinement layers, light and current can be confined separately.

The first and the second optical confinement layers can enhance the optical confinement to the active layer 18, and increase the stimulated emission, thereby improving the optical characteristics.

If the active layer 18 has a multiple quantum well structure, the optical confinement factor is small without the first and the second optical confinement layers. But, when the first and the second optical confinement layers are introduced, they can enhance the optical confinement factor. Consequently, the amplification characteristics are greatly improved. If the material substrate 12 is made of GaAs, the first and the second optical confinement layers are made of GaAs, for example. If the material substrate 12 is made of InP, the first and the second optical confinement layers are made of GaInAsP, for example.

In the semiconductor optical amplifier according to the present invention, semiconductor layers are made of material that does not contain aluminum preferably. Generally, the oxidation of material containing aluminum easily occurs. The increase of crystal defects due to this oxidation damages the device performance and device reliability and it is difficult to grow another excellent crystalline layer on the layer containing aluminum because of the surface oxidation. On the other hand, if the above material does not contain aluminum, there is no problem related with the surface oxidation, thereby improving the yield, device characteristics and reliability of the semiconductor optical amplifier according to the present invention.

The semiconductor optical amplifier is combined with another active device (light emitting diodes, semiconductor lasers, electro-absorption semiconductor modulators, Mach-Zehnder type optical modulators, photo diode, etc.) and/or another passive device (optical wave-guides) to form an integrated device. This integrated device removes the following disadvantages: cost increase by use of external filters; the enlargement of the system size.

Having described and illustrated the embodiments of the semiconductor optical amplifiers according to the invention, the application of the present invention is not limited thereto. Details of structures of these devices can be modified as necessary. We therefore claim all modifications and variations coming within the spirit and scope of the following claims.

What is claimed is:

1. A semiconductor optical amplifier comprising:
    a lower cladding layer of a first conductive type, the lower cladding layer including first and second regions, the first and second regions being arranged in a predetermined direction;
    an upper cladding layer of a second conductive type, the upper cladding layer being supported by the first region;
    an active layer provided between the first region of the lower cladding layer and the upper cladding layer, light in the active layer propagating in the predetermined direction;
    a diffraction grating layer having a diffraction grating,
        the diffraction grating extending in the predetermined direction, the diffraction grating layer being supported by the second region,
        the diffraction grating layer being optically coupled to the active layer by abutting contact therewith,
        the diffraction grating diffracting light from the active layer in a direction, the direction being different from the predetermined direction,
        the diffraction grating layer having a bandgap energy greater than the active layer, and
        a surface of the diffraction grating layer having a periodic structure for the diffraction grating;
    a first anti-reflecting coating provided on one end of the semiconductor optical amplifier, the one end of the semiconductor optical amplifier receiving input light, the active layer being located between the first anti-reflecting coating and the diffraction grating layer; and
    a second anti-reflecting coating provided on another end of the semiconductor optical amplifier.

2. The semiconductor optical amplifier according to claim 1, wherein the diffraction grating in the diffraction grating layer has a single period.

3. The semiconductor optical amplifier according to claim 1, wherein the diffraction grating layer includes plural regions arranged sequentially in the predetermined direction, each region has a diffraction grating, the period of the diffraction grating of one region is different from that of the other region.

4. The semiconductor optical amplifier according to claim 3, wherein the period of the diffraction grating of each region is provided such that each region of the diffraction grating layer emits light of a center wavelength different from other regions thereof, each region emitting in substantially a same direction.

5. The semiconductor optical amplifier according to claim 3, wherein the period of the diffraction grating of each region is provided such that each region of the diffraction grating layer emits light of a center wavelength different from other regions thereof, each region emitting in substantially a different direction.

6. The semiconductor optical amplifier according to claim 1, further comprising:
    a first optical confinement layer provided between the active layer and the lower cladding layer, the first optical confinement layer having a bandgap energy between that of the active layer and that of the lower cladding layer, and
    a second optical confinement layer provided between the active layer and the upper cladding layer, the second optical confinement layer having a bandgap energy between that of the active layer and that of the upper cladding layer.

7. The semiconductor optical amplifier according to claim 1, wherein
    the second region of the lower cladding layer has a third region and fourth regions,
    the third region extends in the predetermined direction,
    the third region is located between the fourth regions, and
    the diffraction grating is provided on the third region, the semiconductor optical amplifier further comprising a semiconductor layer of the second conductive type, the semiconductor layer of the second conductive type being provided on the fourth regions, and the semiconductor layer of the second conductive type having a bandgap energy greater than that of the diffraction grating layer.

8. The semiconductor optical amplifier according to claim 7, further comprising:
a lower electrode; a first upper electrode, the lower cladding layer, the active layer and the upper cladding layer being provided between the lower electrode and the first upper electrode; and a second upper electrode electrically isolated from the first upper electrode,
wherein the lower cladding layer and the semiconductor layer of the second conductive type is provided between the lower electrode and the second upper electrode.

9. The semiconductor optical amplifier according to claim 1, wherein the first region of the lower cladding layer has a fifth region and sixth regions, the fifth region extends in the predetermined direction, the fifth region is provided between the sixth regions, the active layer is provided on the fifth region, and the upper cladding layer is provided on the sixth regions and the active layer.

10. The semiconductor optical amplifier according to claim 1, wherein the periodic structure of the diffraction grating layer is exposed to air.

11. The semiconductor optical amplifier according to claim 1, wherein the surface of the diffraction grating layer is covered with a dielectric film.

12. The semiconductor optical amplifier according to claim 11, wherein the dielectric film is made of silicon nitride.

13. The semiconductor optical amplifier according to claim 11, wherein the dielectric film is made of silicon oxide.

* * * * *